(12) United States Patent
Canella (10) Patent No.: US 7,192,806 B2
(45) Date of Patent: Mar. 20, 2007

(54) METHOD OF ESTABLISHING NON-PERMANENT ELECTRICAL CONNECTION BETWEEN AN INTEGRATED CIRCUIT DEVICE LEAD ELEMENT AND A SUBSTRATE

(75) Inventor: Robert L. Canella, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/992,384

(22) Filed: Nov. 18, 2004

(65) Prior Publication Data

US 2005/0067687 A1    Mar. 31, 2005

Related U.S. Application Data

(62) Division of application No. 09/934,175, filed on Aug. 21, 2001, now Pat. No. 7,045,889.

(51) Int. Cl.
*H01L 23/48* (2006.01)

(52) U.S. Cl. .............................. 438/117; 257/E23.078; 361/769

(58) Field of Classification Search ................ 257/710, 257/727, 785; 438/15, 117; 361/769, 787
See application file for complete search history.

(56) References Cited

U.S. PATENT DOCUMENTS

| | | | |
|---|---|---|---|
| 3,569,790 A | 3/1971 | Jenik | |
| 3,573,617 A | 4/1971 | Randolph et al. | |
| 3,670,409 A | 6/1972 | Reiner | |
| 4,210,383 A | 7/1980 | Davis | |
| 4,713,611 A | 12/1987 | Solstad et al. | |
| 4,716,049 A | 12/1987 | Patraw | |
| 4,760,335 A | 7/1988 | Lindberg | |
| 4,774,632 A | 9/1988 | Neugebauer | |
| 4,878,846 A | 11/1989 | Schroeder | |

(Continued)

FOREIGN PATENT DOCUMENTS

JP    03206681 A    9/1991

(Continued)

OTHER PUBLICATIONS

Merriam Webster's Collegiate Dictionary, 10th edition, p. 889.

*Primary Examiner*—Carl Whitehead, Jr.
*Assistant Examiner*—Jennifer M Dolan
(74) *Attorney, Agent, or Firm*—TraskBritt (57) ABSTRACT

A spring contact for establishing electrical contact between a lead element of an IC device and a substrate. The spring contact generally comprises a contact portion and a base portion. The contact portion, which generally comprises a coil-type compression spring, is configured to engage and resiliently bias against a lead element of the IC device. The spring contact is disposed in a mating aperture formed in the substrate. The base portion of the spring contact is configured to secure the spring contact within the mating aperture and to establish electrical contact with the substrate. A plurality of such spring contacts and mating apertures may be arranged on the substrate in an array corresponding to the pin-out of the IC device. A clamping element secures the IC device to the substrate and biases the IC device against the spring contacts.

16 Claims, 10 Drawing Sheets

U.S. PATENT DOCUMENTS

| | | |
|---|---|---|
| 4,893,172 A | 1/1990 | Matsumoto et al. |
| 4,902,606 A | 2/1990 | Patraw |
| 4,924,353 A | 5/1990 | Patraw |
| 4,933,808 A | 6/1990 | Horton et al. |
| 4,975,079 A | 12/1990 | Beaman et al. |
| 5,006,792 A | 4/1991 | Malhi et al. |
| 5,015,191 A | 5/1991 | Grabbe et al. |
| 5,073,117 A | 12/1991 | Malhi et al. |
| 5,086,337 A | 2/1992 | Noro et al. |
| 5,097,101 A | 3/1992 | Trobough |
| 5,139,427 A | 8/1992 | Boyd et al. |
| 5,144,747 A | 9/1992 | Eichelberger |
| 5,149,662 A | 9/1992 | Eichelberger |
| 5,152,695 A | 10/1992 | Grabbe et al. |
| 5,153,814 A | 10/1992 | Wessely |
| 5,173,055 A | 12/1992 | Grabbe |
| 5,175,491 A | 12/1992 | Ewers |
| 5,198,963 A | 3/1993 | Gupta et al. |
| 5,208,529 A | 5/1993 | Tsurishima et al. |
| 5,228,861 A | 7/1993 | Grabbe |
| 5,245,277 A | 9/1993 | Nguyen |
| 5,289,117 A | 2/1994 | Van Loan et al. |
| 5,321,277 A | 6/1994 | Sparks et al. |
| 5,329,423 A | 7/1994 | Scholz |
| 5,367,253 A | 11/1994 | Wood et al. |
| 5,376,010 A | 12/1994 | Petersen |
| 5,396,032 A | 3/1995 | Bonham, Jr. et al. |
| 5,400,220 A | 3/1995 | Swamy |
| 5,420,506 A | 5/1995 | Lin |
| 5,476,211 A | 12/1995 | Khandros |
| 5,477,086 A | 12/1995 | Rostoker et al. |
| 5,477,161 A | 12/1995 | Kardos et al. |
| 5,502,397 A | 3/1996 | Buchanan |
| 5,517,515 A | 5/1996 | Spall et al. |
| 5,545,050 A | 8/1996 | Sato et al. |
| 5,556,293 A | 9/1996 | Pfaff |
| 5,570,033 A | 10/1996 | Staab |
| 5,578,870 A | 11/1996 | Farnsworth et al. |
| 5,602,422 A | 2/1997 | Schueller et al. |
| 5,611,705 A | 3/1997 | Pfaff |
| 5,628,635 A | 5/1997 | Ikeya |
| 5,629,837 A | 5/1997 | Barabi et al. |
| 5,632,631 A | 5/1997 | Fjelstad et al. |
| 5,637,008 A | 6/1997 | Kozel |
| 5,646,447 A | 7/1997 | Ramsey |
| 5,646,542 A | 7/1997 | Zamborelli et al. |
| 5,647,756 A | 7/1997 | Twigg et al. |
| 5,648,893 A | 7/1997 | Loo et al. |
| 5,655,926 A | 8/1997 | Moon |
| 5,656,945 A | 8/1997 | Cain |
| 5,669,774 A | 9/1997 | Grabbe |
| 5,686,843 A | 11/1997 | Beilstein, Jr. et al. |
| 5,691,041 A | 11/1997 | Frankeny et al. |
| 5,692,911 A | 12/1997 | Webster et al. |
| 5,702,255 A | 12/1997 | Murphy et al. |
| 5,727,954 A | 3/1998 | Kato et al. |
| 5,730,606 A | 3/1998 | Sinclair |
| 5,746,608 A | 5/1998 | Taylor |
| 5,751,554 A | 5/1998 | Williams et al. |
| 5,786,704 A | 7/1998 | Kim |
| 5,789,271 A | 8/1998 | Akram |
| 5,791,914 A | 8/1998 | Loranger et al. |
| 5,800,205 A | 9/1998 | Arakawa |
| 5,802,699 A | 9/1998 | Fjelstad et al. |
| 5,810,609 A | 9/1998 | Faraci et al. |
| 5,812,378 A | 9/1998 | Fjelstad et al. |
| 5,823,800 A | 10/1998 | Suehrcke et al. |
| 5,829,988 A | 11/1998 | McMillan et al. |
| 5,857,858 A | 1/1999 | Gorowitz et al. |
| 5,887,344 A | 3/1999 | Sinclair |
| 5,888,837 A | 3/1999 | Fillion et al. |
| 5,905,383 A | 5/1999 | Frisch |
| RE36,217 E | 6/1999 | Petersen |
| 5,923,181 A | 7/1999 | Beilstein, Jr. et al. |
| 5,934,914 A | 8/1999 | Fjelstad et al. |
| 5,944,537 A * | 8/1999 | Smith et al. ................. 439/81 |
| 5,947,751 A | 9/1999 | Massingill |
| 5,955,888 A | 9/1999 | Frederickson et al. |
| 5,959,840 A | 9/1999 | Collins et al. |
| 5,973,340 A | 10/1999 | Mohsen |
| 5,973,394 A | 10/1999 | Slocum et al. |
| 5,978,223 A | 11/1999 | Hamilton et al. |
| 5,982,185 A | 11/1999 | Farnworth |
| 5,983,492 A | 11/1999 | Fjelstad |
| 5,984,694 A | 11/1999 | Sinclair |
| 6,002,590 A | 12/1999 | Farnworth et al. |
| 6,007,349 A | 12/1999 | Distefano et al. |
| 6,020,597 A | 2/2000 | Kwak |
| 6,036,503 A | 3/2000 | Tsuchida |
| 6,037,667 A | 3/2000 | Hembree et al. |
| 6,042,387 A | 3/2000 | Jonaidi |
| 6,043,563 A | 3/2000 | Eldridge et al. |
| 6,043,666 A | 3/2000 | Kazama |
| 6,062,874 A | 5/2000 | Matsuda et al. |
| 6,174,174 B1 | 1/2001 | Suzuki et al. |
| 6,190,181 B1 | 2/2001 | Affolter et al. |
| 6,229,320 B1 | 5/2001 | Haseyama et al. |
| 6,249,440 B1 | 6/2001 | Affolter |
| 6,333,638 B1 | 12/2001 | Fukasawa et al. |
| 6,341,962 B1 | 1/2002 | Sinclair |
| 6,390,826 B1 | 5/2002 | Affolter et al. |
| 6,407,566 B1 | 6/2002 | Brunelle et al. |
| 6,409,521 B1 | 6/2002 | Rathburn |
| 6,439,897 B1 | 8/2002 | Ikeya |
| 6,464,513 B1 | 10/2002 | Momenpour et al. |
| 6,471,524 B1 * | 10/2002 | Nakano et al. ................. 439/70 |
| 6,503,089 B2 | 1/2003 | Saijo et al. |
| 6,512,388 B1 * | 1/2003 | Satoh et al. ................. 324/755 |
| 6,535,002 B2 | 3/2003 | Haseyama et al. |
| 6,549,418 B1 | 4/2003 | Deeney |
| 6,551,112 B1 | 4/2003 | Li et al. |
| 6,672,876 B1 | 1/2004 | Takekoshi |
| 6,781,390 B2 * | 8/2004 | Kazama ..................... 324/754 |
| 6,821,129 B2 | 11/2004 | Tsuchiya |
| 2001/0011898 A1 | 8/2001 | Haseyama et al. |
| 2002/0027445 A1 | 3/2002 | Sausen |
| 2002/0060579 A1 | 5/2002 | Haseyama et al. |
| 2002/0075025 A1 | 6/2002 | Tanaka |
| 2003/0042595 A1 | 3/2003 | Canella |

FOREIGN PATENT DOCUMENTS

| | | |
|---|---|---|
| JP | 10-293156 | 11/1998 |
| JP | 2000-123935 | 4/2000 |

\* cited by examiner

METHOD OF ESTABLISHING NON-PERMANENT ELECTRICAL CONNECTION BETWEEN AN INTEGRATED CIRCUIT DEVICE LEAD ELEMENT AND A SUBSTRATE

CROSS-REFERENCE TO RELATED APPLICATION

This application is a divisional of application Ser. No. 09/934,175, filed Aug. 21, 2001, now U.S. Pat. No. 7,045,889, issued May 16, 2006.

BACKGROUND OF THE INVENTION

1. Field of the Invention

The present invention relates generally to the assembly and testing of integrated circuit device components, such as multichip modules. Specifically, the present invention relates to a device and method for removably securing an integrated circuit device to a substrate and, in particular, to a spring contact for establishing a non-permanent electrical connection between a lead element of an integrated circuit device and a substrate.

2. State of the Art

Integrated circuit (IC) devices, such as Ball Grid Array (BGA) packages and Small Outline J-Lead (SOJ) packages, are commonly assembled into multichip modules for connection to higher-level packaging, such as a motherboard or a personal computer chassis. Generally, a multichip module (MCM) includes a carrier substrate, such as a printed circuit board, having a plurality of IC devices mounted thereto. Other electrical components, such as resistors, capacitors, inductors, or other suitable devices, may also be mounted on the carrier substrate of the MCM, or even on the IC devices. Electrical communication among the IC devices, between the IC devices and other electrical components on the multichip module, and between the devices and external components is established by conductors on the MCM carrier substrate. The conductors may be conductive traces fabricated on the surface of, or internal to, a printed circuit board. Methods for fabricating printed circuit boards having conductive traces, as well as other types of substrates having conductors thereon, are well known in the art.

Figure 1:
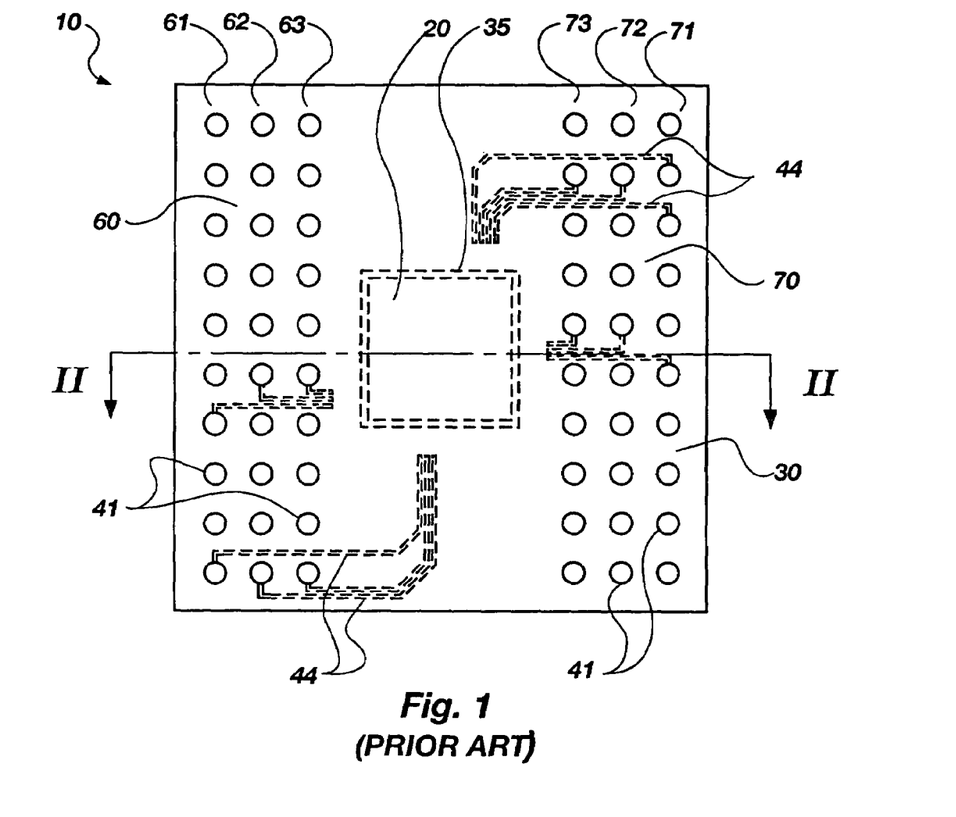
FIG. 1 shows a plan view of an exemplary embodiment of a conventional BGA package.
Figure 2:
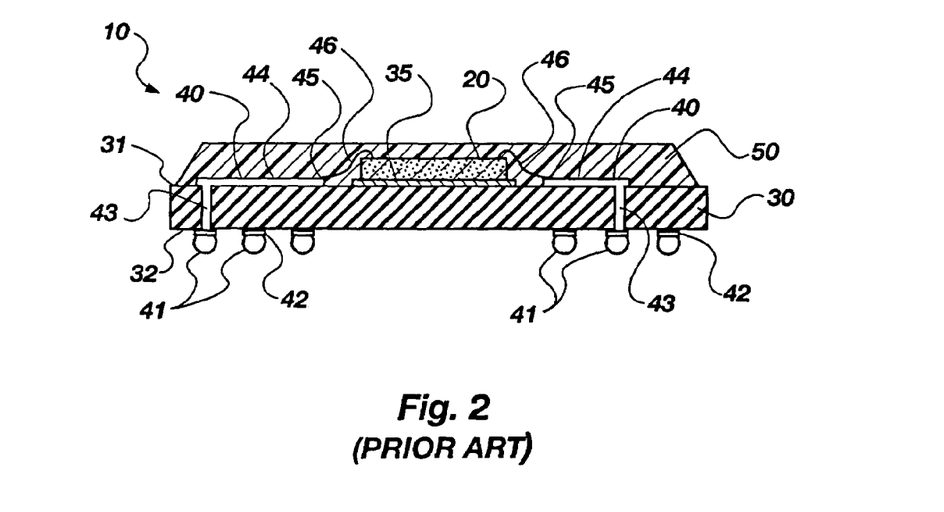
FIG. 2 shows a cross-sectional view of the conventional BGA package as taken along line II-II of FIG. 1.

Conventional IC devices, such as BGA, TSOP, SOP, SOJ, etc. packages, generally comprise a semiconductor die electrically connected to a plurality of electrical leads that is encased within an encapsulant material, a portion of each of the electrical leads extending from the encapsulant material and configured for establishing electrical connections between the semiconductor die and external components or higher-level packaging. An exemplary embodiment of a conventional BGA package is shown in FIGS. 1 and 2. The conventional BGA package 10 includes a semiconductor die 20 secured to a die-attach pad 35 formed on an upper surface 31 of a substrate 30, which may also be termed an "interposer." The BGA package 10 also includes a plurality of electrical leads 40 adapted to provide electrical communication between the semiconductor die 20 and one or more external components (not shown). The semiconductor die 20 and at least a portion of each electrical lead 40 may be encased by an encapsulant material 50. The conventional BGA package 10 may be a memory device, such as a DRAM chip, a processor, or any other integrated circuit device known in the art.

Each of the electrical leads 40 includes an external conductive ball (or bump, pillar, or other lead element) 41 configured for electrical connection to an external component. The conductive ball 41 may be secured to a conductive pad 42 formed on a lower surface 32 of the substrate 30. Each electrical lead 40 further comprises a conductive via 43 extending from the conductive pad 42 and through the substrate 30 to a conductive trace 44. The conductive trace 44 (only a few of which are shown in FIG. 1 for clarity) is formed on the upper surface 31 of the substrate 30 and provides an electrical path from the conductive via 43 to a bond end 45 located proximate the semiconductor die 20. A bond wire 46 attached to the bond end 45 of the conductive trace 44 and extending to the semiconductor die 20, where the bond wire 46 is attached to a bond pad thereon, electrically connects the electrical lead 40 to the semiconductor die 20. At least the bond wire 46 and conductive trace 44 of each electrical lead 40 may be encased by the encapsulant material 50.

The conventional BGA package 10 may include a plurality of the conductive balls 41 arranged, for example, in an array or arrays of mutually adjacent rows and columns. Referring to FIG. 1, the conductive balls 41 may be arranged in two arrays 60, 70, each array 60, 70 disposed between an edge of the semiconductor die 20 and a peripheral edge of the substrate 30. Each array 60, 70 comprises three columns 61, 62, 63, 71, 72, 73, respectively, of conductive balls 41. The arrangement of conductive balls 41 is typically referred to as the "pin-out" or the "footprint" of the BGA package 10. Those of ordinary skill in the art will understand that the particular pin-out of the BGA package 10 may vary depending upon the application and that the pin-out may be of any suitable configuration.

To attach and electrically connect the conductive balls 41 of the BGA package 10 to a substrate, such as, for example, an MCM carrier substrate or a burn-in board, the substrate is configured with a plurality of contact pads arranged in a number of contact pad arrays. Each contact pad array includes a number of contact pads arranged in a pattern corresponding to the pin-out of the BGA package 10. The conductive balls 41 of the BGA package 10 may be formed of solder or a conductive or conductor-filled epoxy. If solder, the conductive balls 41 are reflowed to connect to the contact pads of the contact pad array on the substrate. If epoxy, the conductive balls 41 may be first heated to a tacky "B" stage to adhere to the contact pads, and then further heated to completely cure the epoxy to a "C" stage. A substrate may include a plurality of IC devices mounted thereto, wherein each of the IC devices is permanently attached to a corresponding contact pad array on a surface of the substrate. By way of example, an MCM may be a memory module comprised of a one-piece carrier substrate having opposing surfaces, with one or both of the opposing surfaces of the carrier substrates including multiple contact pad arrays and a plurality of IC devices, such as BGA and SOJ packages, mounted thereto.

During the fabrication of an IC device, the IC device may be subjected to individual component-level testing, such as burn-in and electrical testing. An IC device that exhibits a desired level of performance during component-level testing is generally referred to as a "known good device" or "known good die" while an IC device failing to meet minimum performance characteristics may be referred to as a "known bad device." After component-level testing, the IC device may be assembled into higher-level packaging, such as an MCM, and again subjected to testing. Testing of higher-level packaging such as an MCM, referred to herein as module-level testing, may include burn-in, electrical characterization and performance evaluation, as well as other desired electrical testing.

If an MCM fails to exhibit minimum operating characteristics during module-level testing, an IC device causing the failure, which may have previously been identified as a "known good device" during component-level testing—must be removed from the MCM and replaced. Also, it may be desirable to introduce a "known bad" IC device into an MCM for module-level testing in order to observe the electrical characteristics of the MCM with the "known bad" IC device, or to observe the electrical characteristics of the "known bad" IC device at the module-level. After module-level testing is complete, the "known bad" IC device must be removed from the MCM and replaced. Thus, although individual IC devices are typically tested at the component level, it is desirable to subject IC devices to further testing at the module-level, as a "known good device" may fail at the module level and, further, because incorporation of a "known bad device" into an MCM may be useful in module-level testing.

To test IC devices in a higher-level environment, module-testing is generally performed after the IC devices are assembled into and permanently attached to, for example, an MCM carrier substrate. Thus, if an IC device must be removed from an MCM after module-level testing, the permanent electrical bonds between the electrical leads of the IC device, for example, the conductive balls 41 of the conventional BGA package 10, and the contact pads on the MCM carrier substrate must be severed. Severing these permanent electrical bonds—which, as noted previously, typically comprise solder or conductive epoxy, may cause both heat-induced and mechanical damage to the MCM carrier substrate and conductors, to the electrical leads and electrical bonds of the IC devices remaining on the MCM, and to other electrical components mounted on the MCM.

Also, it may be necessary to remove an IC device from a substrate to achieve an upgrade. For example, as technological advances are made by IC device manufacturers, it is often desirable to replace an IC device mounted to a substrate with a next-generation IC device exhibiting improved performance characteristics. To replace an obsolete IC device mounted to a substrate, such as the carrier substrate of an MCM comprising part of, for example, a personal computer, the permanent electrical bonds between the electrical leads of the obsolete IC device and a plurality of contact pads on the substrate must be severed, which may cause both heat-induced and mechanical damage to the substrate and to other IC devices remaining on the substrate.

To prevent heat-induced and mechanical damage resulting from severing of the permanent electrical bonds between the electrical leads of an IC device and a plurality of contact pads on a substrate, the IC device may be non-permanently attached to the substrate for module-level testing, as well as for final assembly. Use of non-permanent connections between the electrical leads of an IC device and a contact pad array of a substrate allows for easy removal of the IC device after module-level testing or after final assembly without any resulting damage from the severing of permanent electrical bonds. Sockets and fixtures for non-permanently attaching an IC device to a substrate are well known in the art; however, such sockets can be relatively expensive and their cost often does not justify their use. Although the cost of conventional sockets and fixtures may, in some instances, be acceptable for limited use applications, such as testing and small production runs, their cost is generally not acceptable for full-scale production.

Use of non-permanent electrical connections between the electrical leads of an IC device and a contact pad array of a substrate can, however, itself cause problems during module-level testing and/or at final assembly. Non-planarities in the substrate, in the conductors forming a contact pad array, or in the IC device itself, may, in the absence of a permanent bonding agent, result in poor electrical contact between an electrical lead of the IC device and a corresponding contact pad on the substrate. For example, non-planarities in the substrate 30 of the BGA package 10, as well as inconsistency in size of the conductive balls 41, may result in unreliable electrical contact between the conductive balls 41 and the contact pads of a substrate in the absence of a permanent bonding agent. Similarly, for other types of IC devices, such as the SOJ package, deflection of their electrical leads as they come into contact with the contact pads on the substrate may, again, in the absence of a permanent bonding agent such as solder or conductive epoxy, result in poor electrical contact. Poor electrical contact resulting from non-planarities and/or lead deflections may produce unreliable test data during module-level testing or prohibit the acquisition of any meaningful test data, and such poor electrical contact may result in non-functional assembled IC device components or assembled IC device components which do not comply with customer or industry specifications. In addition, the use of non-permanent electrical connections between the electrical leads of an IC device and a contact pad array may result in an overly long electrical path with increased inductance, a characteristic which degrades signal integrity at high device operational speeds.

Therefore, a need exists in the art for a low-cost device and method of forming non-permanent electrical connections between the electrical leads of an IC device and a contact pad array of a substrate. Such an apparatus and method must also provide for robust and reliable electrical connections between the electrical leads of an IC device and the contact pads on a substrate.

BRIEF SUMMARY OF THE INVENTION

The present invention comprises embodiments of a spring contact for establishing electrical contact between an electrical lead or leads of an IC device and a substrate. The spring contacts may be used with any suitable IC device, including BGA packages, SOJ packages, as well as other types of IC devices. Further, the spring contacts of the present invention provide a low-cost method of establishing non-permanent and reliable electrical connections between a plurality of lead elements extending between an IC device and a substrate, such as an MCM carrier substrate or a burn-in board.

A spring contact according to the invention generally comprises a contact portion and a base portion. The spring contact is disposed in an aperture formed in a substrate. The aperture may include both a seat portion and a base portion. A plurality of such spring contacts and mating apertures may be arranged on the substrate in an array corresponding to the pin-out of an IC device to be mounted on the substrate. The contact portion, which generally comprises a coil-type compression spring, of the spring contact is configured to engage and resiliently bias against a lead element of an IC device. The contact portion may also be configured to align, or assist in aligning, the IC device lead element relative to the spring contact and substrate. The base portion of the spring contact is configured to secure the spring contact within the base portion of its mating aperture and to establish electrical contact with the substrate. The seat portion of the mating aperture may also be configured to align, or assist in aligning, the IC device lead element relative to the spring contact and substrate. A clamping element, such as a stab-in-place clip, is used to secure the IC device to the substrate and to bias the IC device against the spring contacts.

Electrical contact between the spring contact and the substrate may be established by disposing a layer of conductive material on at least a portion of an interior wall of the mating aperture, which may or may not extend through the substrate. A conductive trace formed on a surface of the substrate may be electrically connected to the layer of conductive material. Alternatively, a conductive filler material may be disposed in the mating aperture, wherein the spring contact extends to, or extends into, the conductive filler material. A conductive trace formed on a surface of the substrate may be electrically connected to the conductive filler material. In a further embodiment, a layer of conductive material is disposed on at least a portion of an interior wall of the mating aperture and is electrically connected to an intermediate conductive plane of the substrate. Electrical contact between the spring contact and the lead element of an IC device may be facilitated by providing one or more contact elements on the spring contact, including square edges, blades, barbs, and/or roughened surfaces.

BRIEF DESCRIPTION OF THE SEVERAL VIEWS OF THE DRAWINGS

While the specification concludes with claims particularly pointing out and distinctly claiming that which is regarded as the present invention, the features and advantages of this invention can be more readily ascertained from the following detailed description of the invention when read in conjunction with the accompanying drawings, in which:

DETAILED DESCRIPTION OF THE INVENTION

Shown in FIGS. 3 through 6 is an embodiment of a spring contact according to the present invention for establishing electrical contact between a lead element of an IC device, such as the conventional BGA package 10 shown in FIGS. 1 and 2, and a substrate. Although the embodiments of a spring contact of the present invention are described herein in the context of mounting and electrically connecting a BGA package to a substrate, those of ordinary skill in the art will understand that the spring contacts of the instant invention may be used with other types of IC devices, such as, for example, an SOJ package. As used herein, the term "lead element" refers to and encompasses any type of conductive ball, pillar, or bump extending from an IC device, as well as a lead finger extending from an IC device having lead frame construction, such as, for example, an SOJ package.

Figure 3:
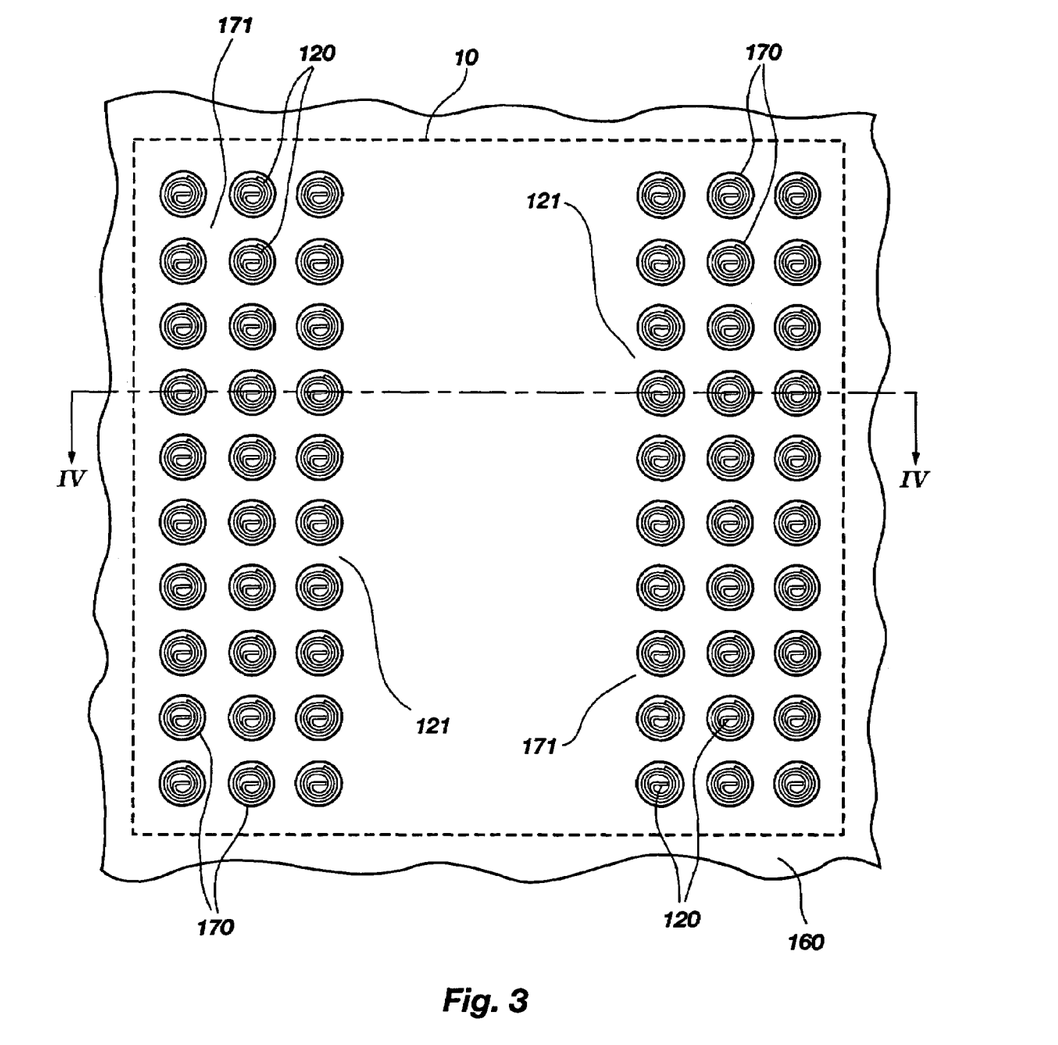
FIG. 3 shows a plan view of a substrate including a plurality of spring contacts according to an embodiment of the invention.
Figure 4:
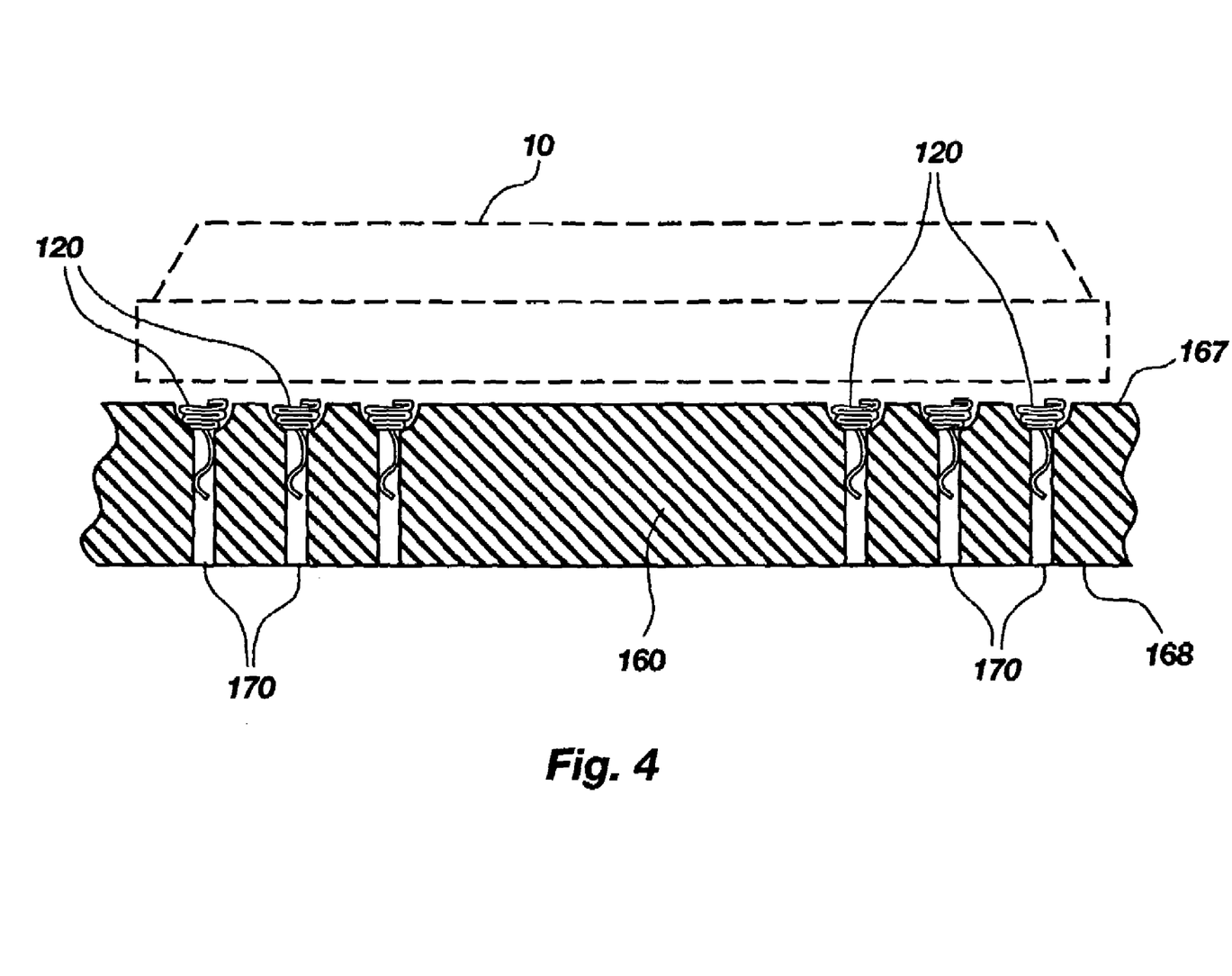
FIG. 4 shows a cross-sectional view of the substrate including a plurality of spring contacts according to the invention as taken along line IV, IV of FIG. 3.

Referring to FIGS. 3 and 4, a one-piece substrate 160 includes a plurality of spring contacts 120 disposed thereon and arranged in rows and columns to form a two-dimensional array 121 of spring contacts 120 corresponding to the footprint of a BGA package, such as the conventional BGA package 10 (shown in FIGS. 3 and 4 in dashed line). Each spring contact 120 is disposed in a mating aperture 170 formed in the substrate 160, and the substrate 160 includes a plurality of such apertures 170 arranged in an array 171 corresponding to the two-dimensional array 121 of spring contacts 120 to be disposed therein, respectively.

The substrate 160 may comprise an MCM carrier substrate and, further, may be constructed of a printed circuit board (PCB) material according to conventional, well-known PCB fabrication techniques. However, it will be appreciated by those of ordinary skill in the art that the substrate 160 may be adapted to applications other than an MCM. For example, the substrate 160 may comprise a test board, such as a burn-in board, or a portion thereof. Also, the substrate 160 may be constructed of any other suitable dielectric or non-conducting materials, including plastics, resins, composites, glasses, ceramics, silicon, other oxide materials, etc.

Figure 5:
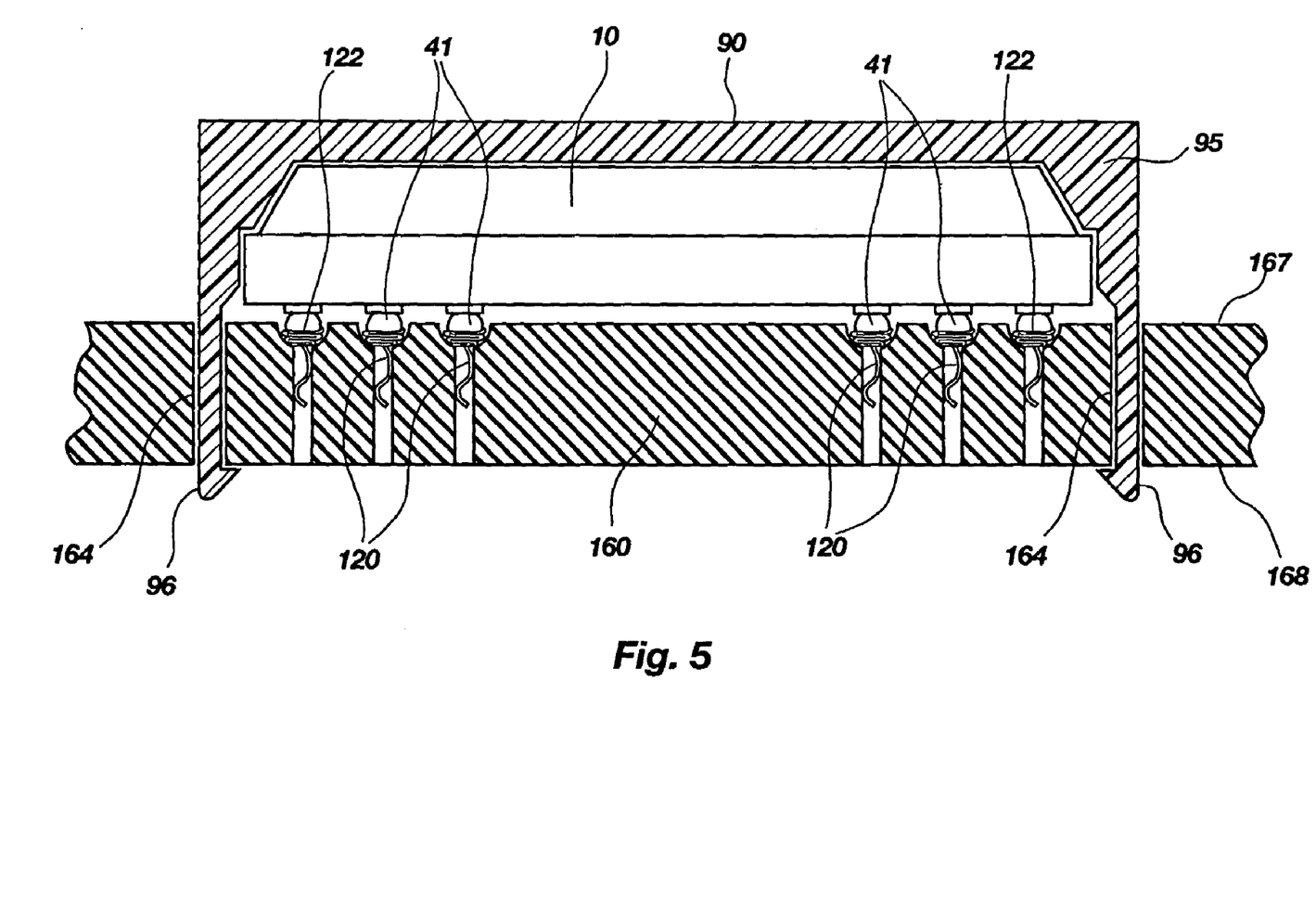
FIG. 5 shows a cross-sectional view of the substrate including a plurality of spring contacts according to the invention as taken along line IV, IV of FIG. 3, and further including a conventional BGA package as shown in FIGS. 1 and 2.

Each spring contact 120 is configured to engage and resiliently bias against an individual conductive ball 41 of the BGA package 10 in order to establish physical and electrical contact between the conductive ball 41 and the spring contact 120. Referring to FIG. 5, the conventional BGA package 10 is shown mounted to the substrate 160. Each conductive ball 41 of the BGA package 10 is engaged with and specifically, as illustrated, at least partially received within a contact portion 122 of a corresponding spring contact 120 disposed on the substrate 160, the array 121 of spring contacts 120, as well as the array 171 of apertures 170, being arranged in a pattern matching the pin-out of the conductive balls 41 extending from the BGA package 10. Thus, an electrical connection is formed between each conductive ball 41 of the BGA package 10 and one of the spring contacts 120 disposed on the substrate 160. Additionally, compression of the spring contacts 120 as BGA package 10 is disposed against substrate 160 will help to reduce inductive electrical effects as the spring contacts 120 are compressed and laterally adjacent coils or segments thereof are placed in mutual contact to effectively shorten the electrical path and reduce inductance.

To secure the BGA package 10 to the substrate 160 and to create both physical and electrical contact between each conductive ball 41 and a mating spring contact 120, the BGA package 10 is held against the substrate 160, and biased against the spring contacts 120, by a clamping element 90. The clamping element 90 illustrated in FIG. 5 may be any suitable clip or clamp known in the art adapted to secure the BGA package 10 to the substrate 160. For example, the clamping element 90 may comprise a stab-in-place clip 95 having one or more resilient tabs or prongs 96 configured for insertion into corresponding holes 164 in the substrate 160. The resilient tab or tabs 96 are retained by the corresponding hole or holes 164 to secure the BGA package 10 to the substrate 160 and to bias the conductive balls 41 thereof against the spring contacts 120. Typically, such stab-in-place type clips 95 are injection molded from plastic materials and are relatively inexpensive. In addition to the foregoing, it is also contemplated that various apparatus disclosed and claimed in copending U.S. patent application Ser. No. 09/478,619, filed Jan. 5, 2000 and assigned to the assignee of the present invention, may be employed to secure BGA package 10 to the substrate 160. The disclosure of U.S. patent application Ser. No. 09/478,619 is hereby incorporated herein by reference.

Figure 6:
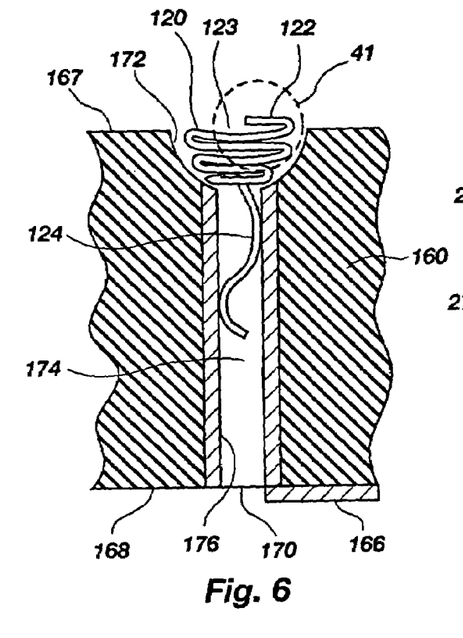
FIG. 6 shows a cross-sectional view of a spring contact according to an embodiment of the invention.

Referring to FIG. 6, each spring contact 120 includes a contact portion 122 and a base portion 124. The contact portion 122 is configured to engage and resiliently bias against a conductive ball 41 of the BGA package 10 and to thereby establish physical and electrical contact with the conductive ball 41. The contact portion 122 generally comprises a coil-type compression spring, as is shown in FIGS. 4 through 6. The base portion 124 is configured to secure the spring contact 120 within its mating aperture 170 and to establish electrical contact between the spring contact 120 and the substrate 160. The base portion 124 may comprise an S-shaped cantilever-type spring, as is shown in FIGS. 4 through 6; however, the base portion 124 may comprise any other suitable shape and configuration, so long as the base portion 124 can be secured in the aperture 170 and form electrical contact therewith.

The contact portion 122 may be further configured to align, or to assist in aligning, the conductive ball 41 relative to the spring contact 120. For example, as shown in FIG. 6, the contact portion 122 may comprise a generally hemispherically or conically shaped coil spring providing a cup or recess 123 for receiving at least a portion of the conductive ball 41. The cup or recess 123 provided by the contact portion 122 functions to guide or align the conductive ball 41 relative to the spring contact 120, and relative to the substrate 160, as the conductive ball 41 engages the contact portion 122 of the spring contact 120. The contact portion 122 may be of any other suitable shape adapted to align the conductive ball 41 relative to the spring contact 120.

Each aperture 170 in substrate 160 may include a seat portion 172 and a retaining portion 174. The seat portion 172 is configured to receive the contact portion 122 of a spring contact 120. The seat portion 172 generally comprises a recess formed in one surface 167 of the substrate 160. The retaining portion 174 is configured to receive and retain the base portion 124 of the spring contact 120 and to establish electrical contact with the spring contact 120. The retaining portion 174 generally comprises a via extending from the seat portion 172 through the substrate 160 and opening to a second opposing surface 168 of the substrate 160.

To secure a spring contact 120 within its mating aperture 170 of the substrate 160, the base portion 124 of the spring contact 120 is inserted into the retaining portion 174 of the aperture 170. The base portion 124 of spring contact 120 makes contact with the retaining portion 174 of aperture 170 and mutual contact forces therebetween (such mutual contact forces resulting from deflection of the base portion 124 upon insertion into the retaining portion 174) create frictional forces that retain the spring contact 120 within the aperture 170. Alternatively, the base portion 124 of a spring contact 120 may be secured within the retaining portion 174 of a mating aperture 170 using a permanent bonding agent, such as solder or a conductive epoxy.

To establish electrical contact between the retaining portion 174 of an aperture 170 and the base portion 124 of a spring contact 120, the retaining portion 174 may, for example, include a layer of conductive material 176 disposed on at least a portion of an interior wall of the retaining portion 174. The layer of conductive material 176 may comprise any suitable conductive material and may be formed or deposited using any suitable process known in the art. A conductive trace 166 disposed or formed on the second opposing surface 168 of the substrate 160 may be electrically connected to the layer of conductive material 176.

The seat portion 172 may be further configured to align, or assist in aligning, the conductive ball 41 relative to the spring contact 120. For example, as shown in FIG. 6, the seat portion 172 may comprise a generally hemispherical recess. As the conductive ball 41 engages the spring contact 120, the hemispherical recess 123 guides the conductive ball 41 (shown in dashed line in FIG. 6) into contact with the contact portion 122 of the spring contact 120. Therefore, such a hemispherical recess 123 functions to align, or assist in aligning, the conductive ball 41 relative to the spring contact 120, as well as relative to the substrate 160. The seat portion 172 may be any other suitable shape adapted to guide the conductive ball 41 into contact with the contact portion 122 of a spring contact 120.

Figure 7:
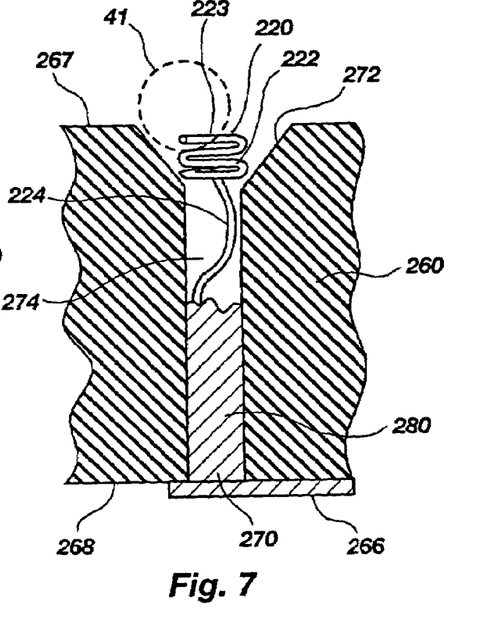
FIG. 7 shows a cross-sectional view of a spring contact according to an embodiment of the invention.

Referring to FIG. 7, a spring contact 220 according to another embodiment of the invention is shown. The spring contact 220 comprises a contact portion 222 and a base portion 224. The base portion 224 is secured within a retaining portion 274 of an aperture 270 formed in a substrate 260. The aperture 270 also includes a seat portion 272 generally comprising a recess formed in one surface 267 of the substrate 260. The spring contact 220 and mating aperture 270 shown in FIG. 7 are similar to the spring contact 120 and aperture 170 shown in FIGS. 3 through 6; however, the contact portion 222 of spring contact 220 comprises a generally cylindrically shaped coil spring providing a cup or recess 223 for receiving at least a portion of a conductive ball 41. The cup or recess 223 provided by the contact portion 222 functions to guide or align the conductive ball 41 relative to the spring contact 220 and substrate 260 as the conductive ball 41 engages the contact portion 222 of the spring contact 220. Also, the seat portion 272 of aperture 270 comprises a generally conical shape for aligning, or assisting in alignment of, the conductive ball 41 (shown in dashed line in FIG. 7) relative to the spring contact 220.

In another alternative embodiment of the invention, as shown in FIG. 7, the aperture 270 is at least partially filled with a conductive filler material 280. The base portion 224 of the spring contact 220 extends to, or extends into, the conductive filler material 280 to establish electrical connection therebetween. A conductive trace 266 formed on a surface 268 of the substrate 260 may be electrically connected to the conductive filler material 280 disposed within the aperture 270. It should be noted that the conductive filler material 280 may itself function to secure the spring contact 220 within the aperture 270. The conductive filler material 280 may be any suitable conductive material known in the art, including solder materials and conductive or conductor-filled epoxies.

Figure 8:
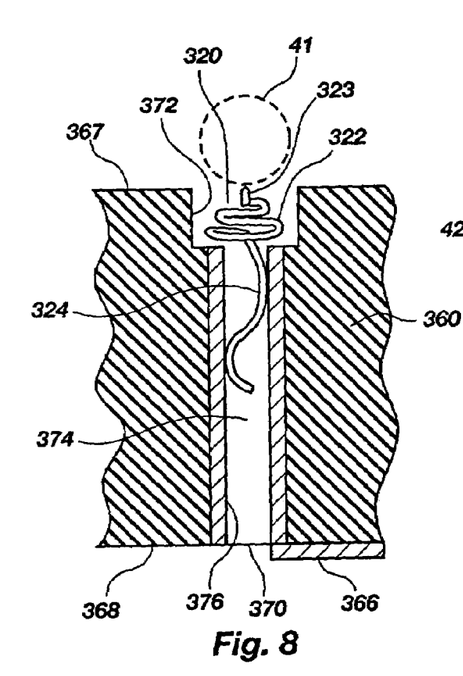
FIG. 8 shows a cross-sectional view of a spring contact according to an embodiment of the invention.

Referring to FIG. 8, a spring contact 320 according to another embodiment of the invention is shown. The spring contact 320 comprises a contact portion 322 and a base portion 324. The base portion 324 is secured within a retaining portion 374 of an aperture 370 formed in a substrate 360. The aperture 370 also includes a seat portion 372 generally comprising a recess formed in one surface 367 of substrate 360. A layer of conductive material 376 is formed on at least a portion of an interior wall of the retaining portion 374 for establishing electrical contact with the spring contact 320. A conductive trace 366 may be formed on a surface 368 of the substrate 360 and electrically connected to the layer of conductive material 376.

The spring contact 320 and mating aperture 370 shown in FIG. 8 are, therefore, similar to the spring contact 120 and aperture 170 shown in FIGS. 3 through 6; however, the contact portion 322 of spring contact 320 comprises a generally cone-shaped coil spring having an apex or point 323 for contacting and/or penetrating the outer surface of a conductive ball 41 (shown in dashed line in FIG. 8). The apex or point 323 can penetrate or puncture any layer of oxide or other contaminants formed on the exterior surface of conductive ball 41, such that reliable electrical contact can be established between the spring contact 320 and the conductive ball 41. It should be understood that any suitable type apex or point 323 capable of penetrating or puncturing a layer or layers of oxide or contaminates on the conductive ball 41 may be used. Also, the seat portion 372 of aperture 370 comprises a generally cylindrical shape for aligning the conductive ball 41 relative to the spring contact 320. It should be noted that, for the embodiment shown in FIG. 8, alignment of the conductive ball 41 relative to the spring contact 320 and substrate 360 is performed primarily by the seat portion 372 of the aperture 370.

Figure 9:
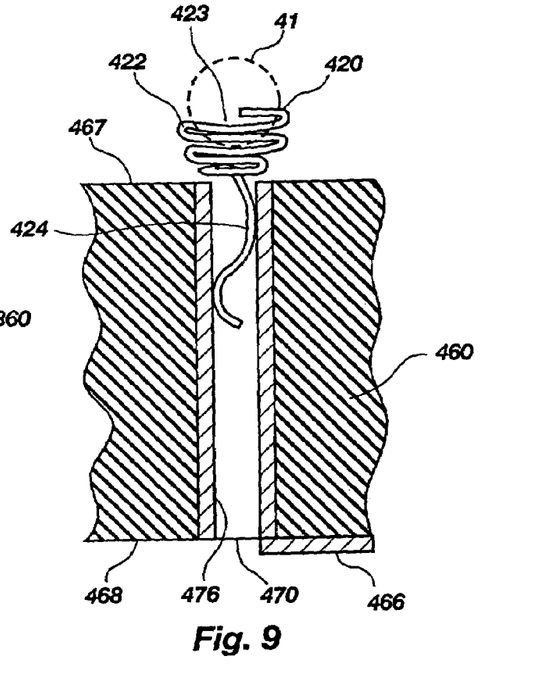
FIG. 9 shows a cross-sectional view of a spring contact according to an embodiment of the invention.

Referring to FIG. 9, a spring contact 420 according to another embodiment of the invention is shown. The spring contact 420 comprises a contact portion 422 and a base portion 424. The base portion 424 is secured within an aperture 470 formed in a substrate 460. The spring contact 420 shown in FIG. 9 is similar to the spring contact 120 shown in FIGS. 3 through 6; however, the aperture 470 receiving the spring contact 420 does not include a seat portion. Rather, the contact portion 422 of the spring contact 420 extends substantially entirely above a surface 467 of the substrate 460. A layer of conductive material 476 is formed on at least a portion of an interior wall of the aperture 470 for establishing electrical contact with the spring contact 420. A conductive trace 466 may be formed on an opposing surface 468 of the substrate 460 and electrically connected to the layer of conductive material 476. For the embodiment shown in FIG. 9, alignment of the conductive ball 41 (shown in dashed line in FIG. 9) relative to the spring contact 420 and substrate 460 is performed primarily by the contact portion 422 of the spring contact 420, which may include a cup or recess 423 for aligning the conductive ball 41 relative thereto.

Figure 10:
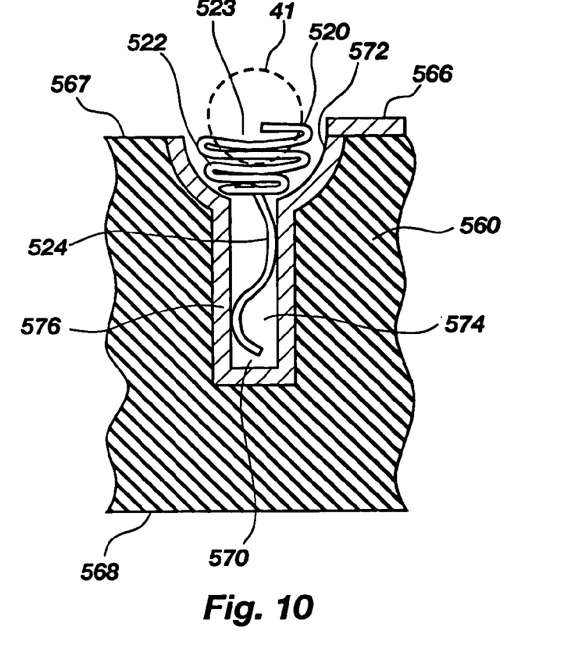
FIG. 10 shows a cross-sectional view of a spring contact according to an embodiment of the invention.

Referring to FIG. 10, a spring contact 520 according to another embodiment of the invention is shown. The spring contact 520 comprises a contact portion 522 and a base portion 524. The spring contact 520 shown in FIG. 10 is similar to the spring contact 120 shown in FIGS. 3 through 6; however, the base portion 524 of the spring contact 520 is secured within a hole 570 formed in a substrate 560, wherein the hole 570 does not extend through the substrate 560. The hole 570, which includes a seat portion 572 and a retaining portion 574, opens only to a surface 567 of the substrate 560 and does not extend to an opposing surface 568 thereof. A layer of conductive material 576 is formed on at least a portion of an interior wall of the seat portion 572 and at least a portion of an interior wall of the retaining portion 574 for establishing electrical contact with the spring contact 520. A conductive trace 566 may be formed on the surface 567 of the substrate 560 and electrically connected to the layer of conductive material 576. For the embodiment shown in FIG. 10, alignment of the conductive ball 41 (shown in dashed line in FIG. 10) relative to the spring contact 520 and substrate 560 is performed primarily by the contact portion 522 of the spring contact 520, which may include a cup or recess 523 for aligning the conductive ball 41 relative thereto.

Figure 11:
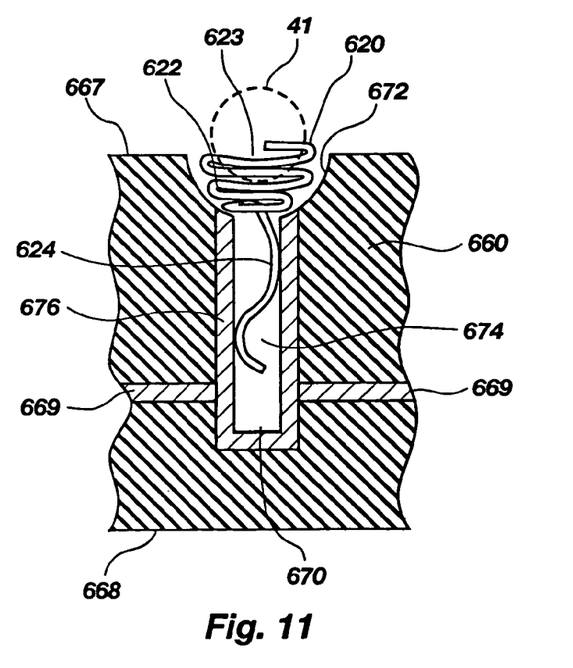
FIG. 11 shows a cross-sectional view of a spring contact according to an embodiment of the invention.

Referring to FIG. 11, a spring contact 620 according to another embodiment of the invention is shown. The spring contact 620 comprises a contact portion 622 and a base portion 624. The spring contact 620 shown in FIG. 11 is similar to the spring contact 120 shown in FIGS. 3 through 6; however, the base portion 624 of the spring contact 620 is secured within a hole 670 formed in a substrate 660, wherein the hole 670 does not extend through the substrate 660. The hole 670, which includes a seat portion 672 and a retaining portion 674, opens only to a surface 667 of the substrate 660 and does not extend to an opposing surface 668 thereof. A layer of conductive material 676 is formed on at least a portion of an interior wall of the retaining portion 674 for establishing electrical contact with the spring contact 620. An intermediate conductive plane or traces 669 may be formed within the thickness of the substrate 660, and the intermediate conductive plane or traces 669, or portions thereof, are electrically connected to the layer of conductive material 676. For the embodiment shown in FIG. 11, alignment of the conductive ball 41 (shown in dashed line in FIG. 11) relative to the spring contact 620 and substrate 660 is performed primarily by the contact portion 622 of the spring contact 620, which may include a cup or recess 623 for aligning the conductive ball 41 relative thereto.

The spring contacts 120, 220, 320, 420, 520, 620 may be constructed of any suitable material exhibiting sufficient resiliency and conductivity. For example, the spring contacts 120, 220, 320, 420, 520, 620 may comprise a beryllium copper material, as well as other copper alloy materials. Generally, the contact portion 122, 222, 322, 422, 522, 622 and base portion 124, 224, 324, 424, 524, 624 will be constructed from a single piece of material, such as beryllium copper wire. However, it is within the scope of the present invention that the contact portion 122, 222, 322, 422, 522, 622 and base portion 124, 224, 324, 424, 524, 624 may be constructed as separate parts that are subsequently joined together.

Figure 12:
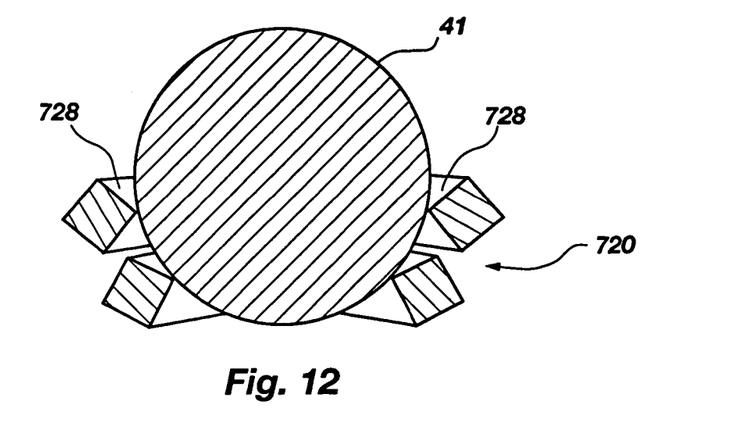
FIG. 12 shows a cross-sectional view of a spring contact according to an embodiment of the invention.

Also, in a further embodiment of the invention, the spring contacts 120, 220, 320, 420, 520, 620 may include, or be constructed from a resiliently conductive wire that includes, one or more contact elements configured to wipe away and/or puncture a layer of oxide and/or other contaminants formed on an exterior surface of a conductive ball 41. For example, as shown in FIG. 12, a spring contact 720 may be constructed from a wire material exhibiting a rectangular cross-section and having a plurality of sharp edges 728 that may function as contact elements. The sharp edges 728 can impinge against and move over the exterior surface of a conductive ball 41, effecting a scraping or penetrating action to remove oxides and other contaminants therefrom or to reach interior portions of conductive ball 41. Alternatively shaped wire, such as one having a triangular cross-section, is also believed suitable for this purpose.

Figure 12A:
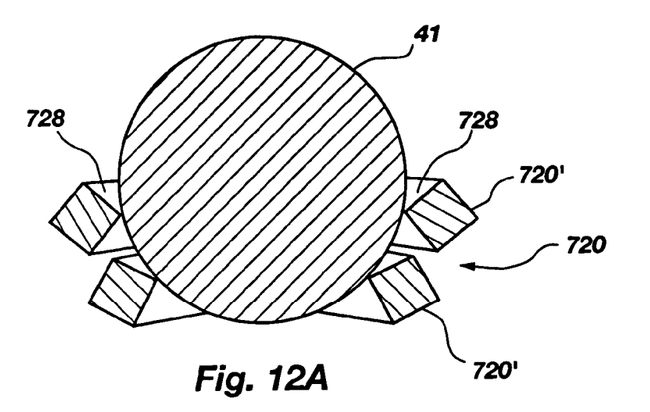
FIG. 12A shows a cross-sectional view of a spring contact according to an embodiment of the invention having the spring coils in contact.

As illustrated in FIG. 12A, the coils 720' of the spring contact 720 are shown in contact with each other when the spring contact 720 is in a collapsed state.

Figure 13:
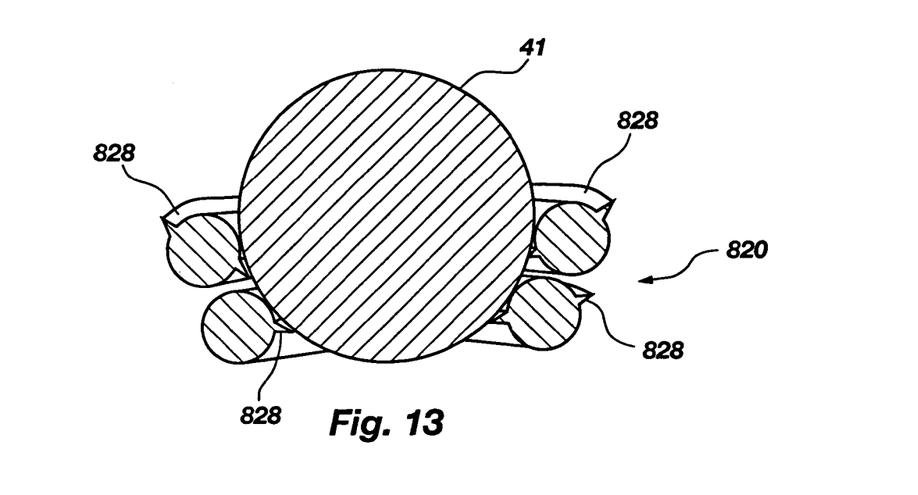
FIG. 13 shows a cross-sectional view of a spring contact according to an embodiment of the invention.

Referring to FIG. 13, a spring contact 820 is constructed from a wire material having a plurality of longitudinally extending blades 828 that may function as contact elements. The longitudinally extending blades 828 can impinge against and move over the exterior surface of a conductive ball 41 to remove oxides and other contaminants therefrom. Blades extending circumferentially or helically about the wire material are also believed suitable for this purpose.

Figure 13A:
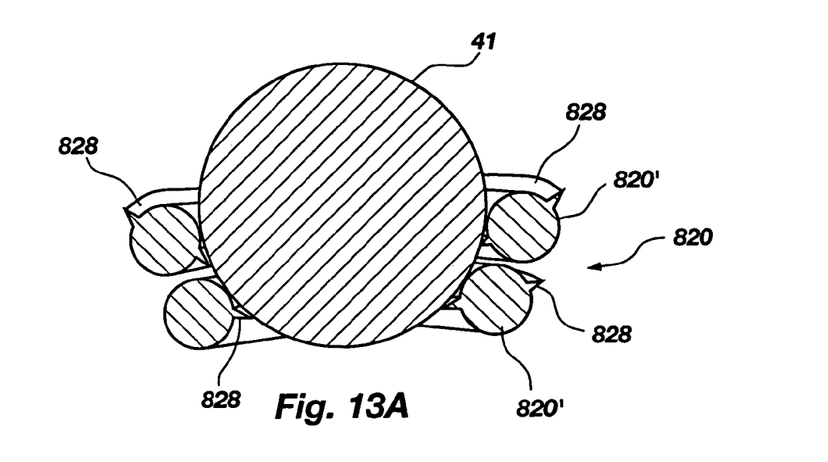
FIG. 13A shows a cross-sectional view of a spring contact according to an embodiment of the invention having the spring coils in contact.

As illustrated in FIG. 13A, the coils 820' of the spring contact 820 are shown in contact with each other when the spring contact 820 is in a collapsed state.

Figure 14:
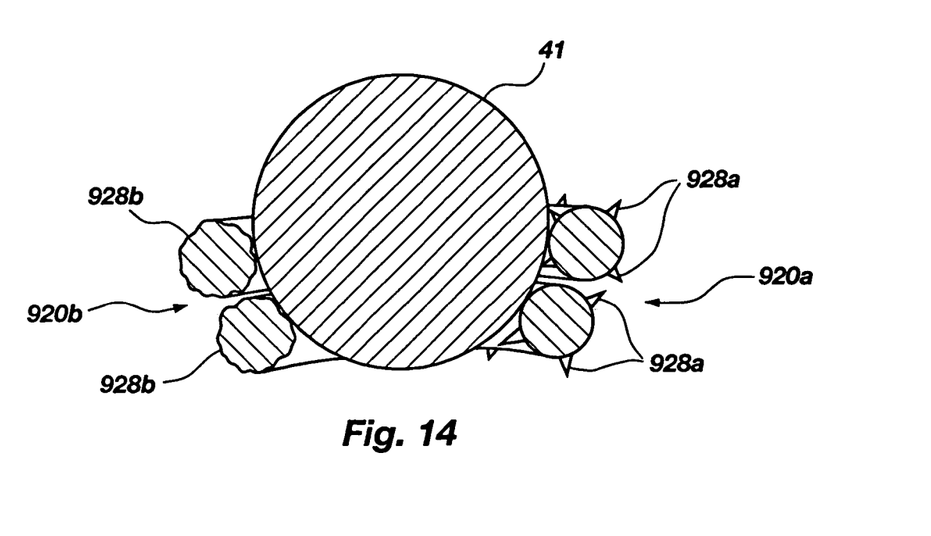
FIG. 14 shows a cross-sectional view of a spring contact according to an embodiment of the invention.

As shown on the right-hand side of FIG. 14, a spring contact 920a may be constructed from a wire material having a plurality of barbs or protrusions 928a extending from an outer cylindrical surface thereof. The barbs or protrusions 928a can impinge against and puncture through layers of oxide and other contaminants on the exterior surface of a conductive ball 41 to form electrical contact therewith. Similarly, as shown on the left-hand side of FIG. 14, a spring contact 920b may be constructed from a wire material simply having a roughened outer surface 928b. The roughened outer surface 928b can impinge against and move over the exterior surface of a conductive ball 41 to remove oxides and other contaminants therefrom.

Figure 14A:
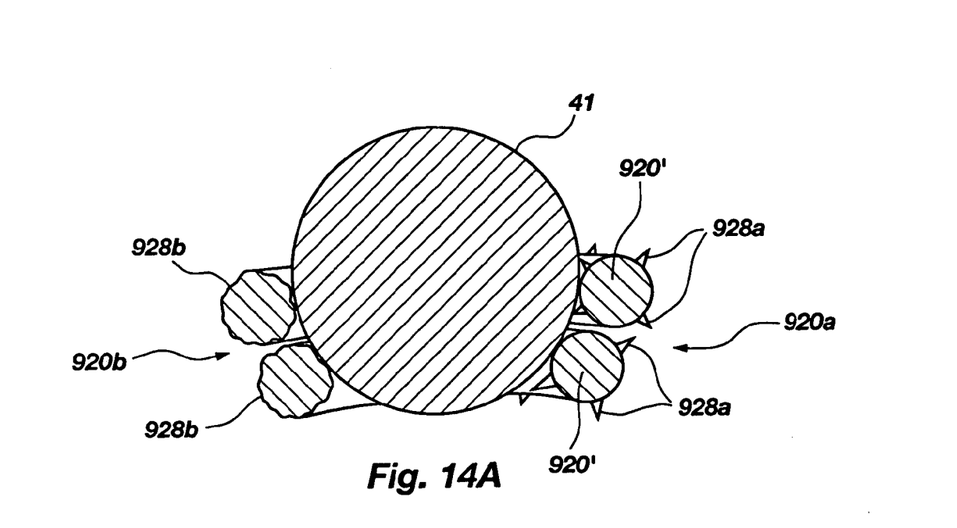
FIG. 14A shows a cross-sectional view of a spring contact according to an embodiment of the invention having the spring coils in contact.

As illustrated in FIG. 14A, the coils 920' of the spring contact 920a are shown in contact with each other when the spring contact 920a is in a collapsed state.

It should be noted that the contact elements 728, 828, 928a, 928b may be used in combination with one another. For example, a spring contact may be constructed from a wire material including one or more longitudinally extending blades and also including a plurality of barbs or protrusions. Also, the contact elements 728, 828, 928a, 928b may be used in conjunction with IC devices having electrical lead elements other than conductive balls, such as, for example, an SOJ package.

Those of ordinary skill in the art will appreciate that the various features of the spring contacts 120, 220, 320, 420, 520, 620, 720, 820, 920a, 920b shown and described with respect to FIGS. 3 through 14 may be used in any suitable combination. A spring contact having any type of contact portion, i.e., a generally hemispherical or conical shape, a generally cylindrical shape, or a cone-shape having an apex, may be used in conjunction with any type of aperture, i.e., one having a hemispherically shaped seat portion, a conically shaped seat portion, a cylindrically shaped seat portion, or no seat portion. For example, a cone-shaped contact portion having an apex (see FIG. 8) may be used with an aperture having a hemispherical shape (see FIG. 6) or a conical shape (see FIG. 7).

Also, for any spring contact according to the present invention, electrical contact between a spring contact and mating aperture formed in a substrate may be established according to any of the embodiments described herein (i.e., a layer of conductive material on an interior wall of the aperture in conjunction with a conductive trace on a surface of the substrate, a conductive filler material within the aperture in conjunction with a conductive trace on a surface of the substrate, a layer of conductive material on an interior wall of a hole partially extending into the substrate in conjunction with a conductive trace on a surface of the substrate, or a layer of conductive material on an interior wall of a hole partially extending into the substrate in conjunction with an intermediate conductive plane of the substrate) or any combination thereof. For example, a conductive filler material (see FIG. 7) may be used in conjunction with an intermediate conductive plane (see FIG. 11) or, alternatively, a spring contact may be configured to establish direct contact with an intermediate conductive plane.

Figure 15:
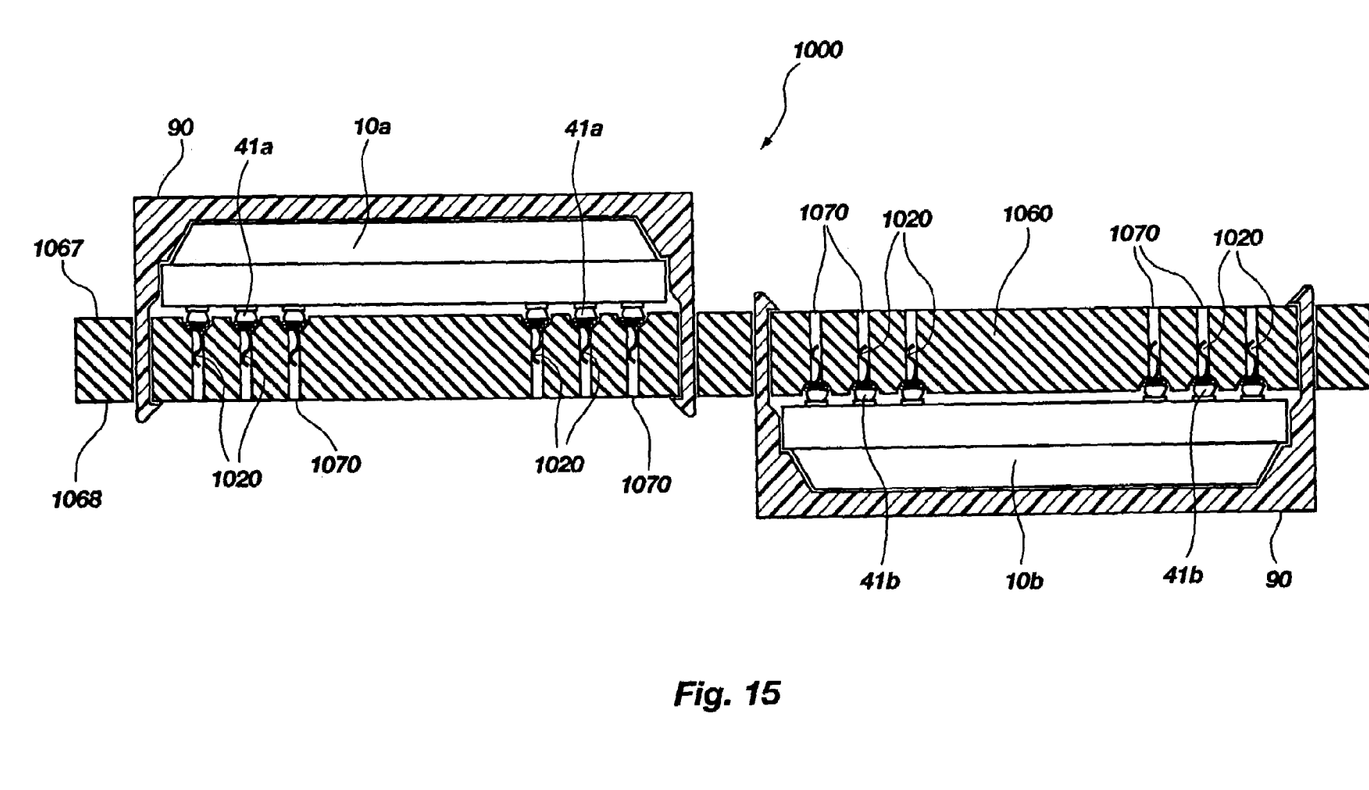
FIG. 15 shows a cross-sectional view of a multichip module incorporating a plurality of spring contacts according to the invention.

Referring to FIG. 15, an MCM 1000 incorporating a plurality of spring contacts 1020 according to the present invention is shown. The MCM 1000 includes a one-piece carrier substrate 1060 having one or more BGA packages 10a mounted to a surface 1067 thereof and having one or more BGA packages 10b mounted to an opposing surface 1068 thereof. Although IC devices are shown mounted to both surfaces 1067, 1068 of the carrier substrate 1060, those of ordinary skill in the art will understand that the MCM 1000 may have IC devices mounted to only one of its carrier substrate surfaces 1067, 1068. The BGA packages 10a, 10b are secured to the carrier substrate 1060 by clamping elements 90, which are shown as stab-in-place clips in FIG. 15. In addition, U.S. patent application Ser. No. 09/478,619, the disclosure of which has been previously incorporated herein by reference, discloses and claims apparatus especially suitable for non-permanently connecting integrated circuit devices such as BGA packages 10a, 10b to MCM substrates such as carrier substrate 1060.

To electrically connect the BGA packages 10a, 10b to the carrier substrate 1060 of the MCM 1000, each of the conductive balls 41a, 41b on the BGA packages 10a, 10b, respectively, is engaged with a mating spring contact 1020 disposed on the MCM carrier substrate 1060. The spring contacts 1020 are retained in respective apertures 1070 formed in the carrier substrate 1060. A spring contact 1020 and mating aperture 1070 may comprise any of the spring contacts 120, 220, 320, 420, 520, 620, 720, 820, 920a, 920b and mating apertures 170, 270, 370, 470, or holes 570, 670 described herein, or include any combination of features described herein.

Figure 16:
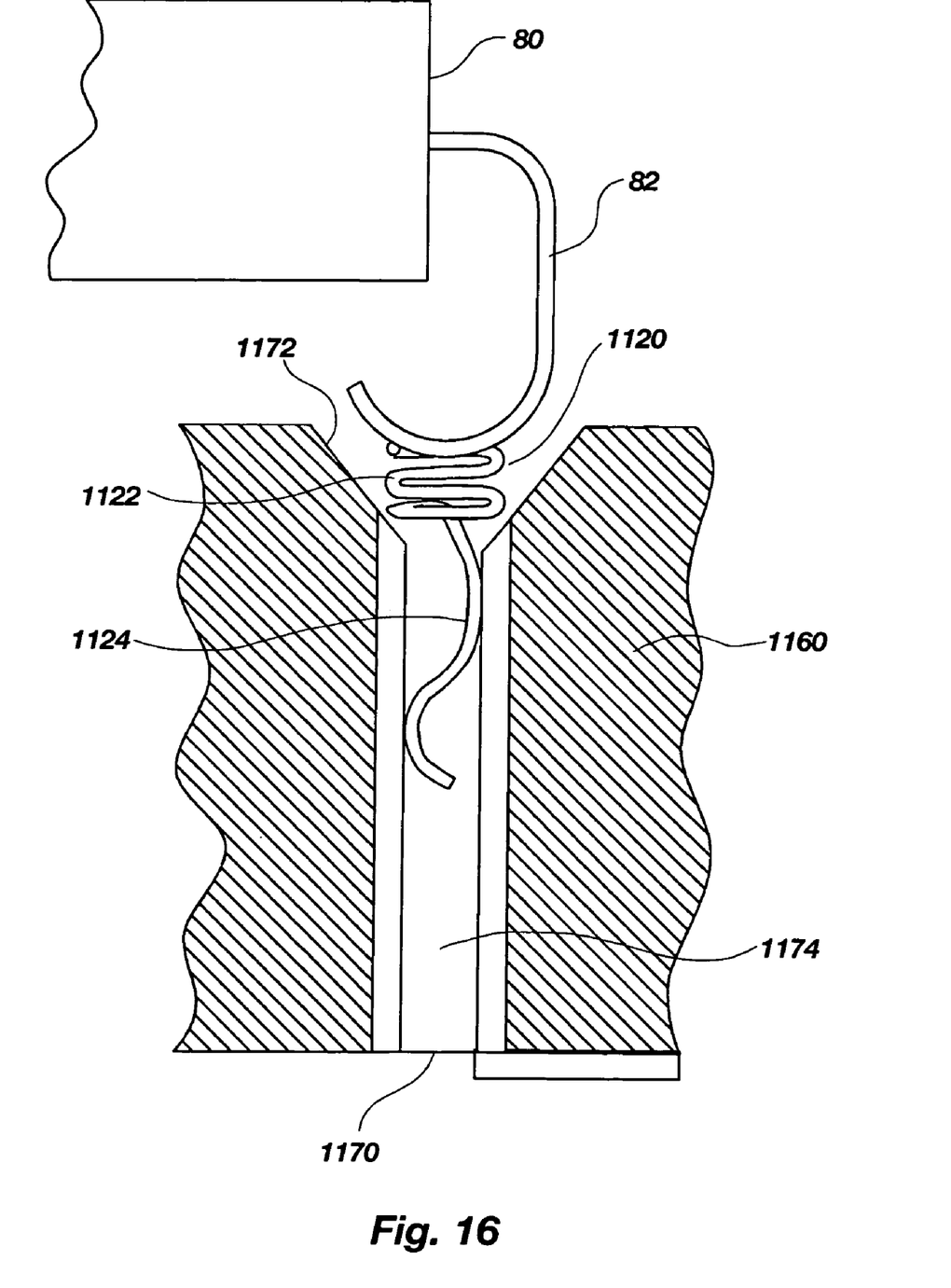
FIG. 16 shows a partial cross-sectional view of a spring contact according to the present invention in conjunction with a conventional SOJ package.

Although the spring contacts 120, 220, 320, 420, 520, 620, 720, 820, 920a, 920b according to the present invention have been described herein in the context of establishing electrical connections with the conductive balls 41 of a conventional BGA package 10, it should be understood by those of ordinary skill in the art that the present invention is not so limited. The spring contacts 120, 220, 320, 420, 520, 620, 720, 820, 920a, 920b may be used to electrically connect the lead elements of other types of IC packages to a substrate. For example, as shown in FIG. 16, a spring contact 1120 may be used to electrically connect a lead element or lead finger 82 extending from an SOJ package 80 to a substrate 1160. The spring contact 1120 includes a contact portion 1122 and a base portion 1124, the base portion 1124 being retained in a retaining portion 1174 of a corresponding aperture 1170. The aperture 1170 also includes a seat portion 1172. The spring contact 1120 and mating aperture 1170 may comprise any of the spring contacts 120, 220, 320, 420, 520, 620, 720, 820, 920a, 920b and mating apertures 170, 270, 370, 470, or holes 570, 670 described herein, respectively, or include any combination of features described herein.

A spring contact according to the present invention having been herein described, those of ordinary skill in the art will appreciate the many advantages of the present invention. The spring contacts of the present invention provide robust and reliable non-permanent electrical connections between a lead element or elements extending between an IC device and a substrate, such as an MCM carrier substrate. The electrical connection provided by such a spring contact can be easily severed without mechanical- or heat-induced damage. Also, use of spring contacts according to the invention enables IC devices to be directly attached to a substrate, without the need for relatively expensive sockets. Further, any of the spring contacts described herein may be used for testing applications, such as for the temporary mounting of IC devices to a burn-in or other test board, or for final assembly of an electrical component, such as an MCM.

The foregoing detailed description and accompanying drawings are only illustrative and are not restrictive. They have been provided primarily for a clear and comprehensive understanding of the present invention and no unnecessary limitations are to be understood therefrom. Numerous additions, deletions, and modifications to the embodiments described herein, as well as alternative arrangements, may be devised by those skilled in the art without departing from the spirit of the present invention and the scope of the appended claims.

What is claimed is:

1. A method of establishing an electrical connection between a substrate and a lead element extending from an IC device, comprising:
    providing an aperture in the substrate having a seat portion opening onto at least one surface of the substrate;
    securing at least a first distal portion of a spring contact within the aperture with a conductive filler material and leaving a second portion of the spring contact free to move within the seat portion of the aperture;
    establishing electrical contact between the at least a first distal portion of the spring contact and the substrate;
    directly contacting the lead element of the IC device against the second portion of the spring contact; and
    securing the IC device to the at least one surface of the substrate to bias the lead element of the IC device against the spring contact and to compress the second portion of the spring contact against a wall of the seat portion of the aperture.

2. The method of claim 1, further comprising at least partially aligning the lead element of the IC device relative to the spring contact using the second portion of the spring contact.

3. The method of claim 1, further comprising at least partially aligning the lead element of the IC device relative to the spring contact using a seat provided by the aperture.

4. The method of claim 1, further comprising compressing a segment of the second portion of the spring contact against another segment thereof to make electrical contact therewith.

5. The method of claim 1, wherein the conductive filler material comprises solder.

6. The method of claim 1, wherein the conductive filler material comprises a conductive epoxy.

7. A method of establishing an electrical connection between a substrate and a plurality of lead elements extending from an IC device, comprising:
    providing a plurality of apertures in the substrate arranged in a pattern corresponding to a footprint of the plurality of lead elements of the IC device, each aperture of the plurality of apertures opening onto at least one surface of the substrate;
    disposing a plurality of spring contacts in the plurality of apertures in a manner wherein at least a first distal portion of each spring contact of the plurality of spring contacts is secured within one aperture of the plurality of apertures with a conductive filler material and a second portion of each spring contact is free to move within a seat portion of the aperture;
    establishing electrical contact between the at least a first distal portion of each spring contact of the plurality of spring contacts and the substrate;
    directly contacting each lead element of the plurality of lead elements of the IC device against the second portion of an associated spring contact of the plurality of spring contacts; and
    securing the IC device to the at least one surface of the substrate to bias each lead element of the plurality of lead elements of the IC device against the associated spring contact of the plurality of spring contacts and to compress the second portion of each associated spring contact against the seat portion of the aperture.

8. The method of claim 7, further comprising at least partially aligning the IC device relative to the substrate using the plurality of spring contacts.

9. The method of claim 7, further comprising at least partially aligning the IC device relative to the substrate using the plurality of apertures.

10. The method of claim 7, further comprising compressing a segment of the second portion of the one spring contact against another segment thereof to make electrical contact therewith.

11. The method of claim 10, further comprising reducing a length of an electrical path through at least one of the spring contacts responsive to the compression of the one segment of the second portion of at least one of the plurality of spring contacts against the another segment thereof.

12. The method of claim 11, further including reducing an inductance associated with the electrical path through the one spring contact responsive to the reduction of the electrical path length.

13. The method of claim 7, further comprising reducing a length of an electrical path through at least some of the plurality of spring contacts responsive to the compression of the second portion of the one spring contact.

14. The method of claim 13, further including reducing an inductance associated with the electrical path through the one spring contact responsive to the reduction of the electrical path length.

15. The method of claim 7, wherein the conductive filler material comprises solder.

16. The method of claim 7, wherein the conductive filler material comprises a conductive epoxy.

* * * * *

UNITED STATES PATENT AND TRADEMARK OFFICE
CERTIFICATE OF CORRECTION

PATENT NO.       : 7,192,806 B2  
APPLICATION NO.  : 10/992384  
DATED            : March 20, 2007  
INVENTOR(S)      : Canella It is certified that error appears in the above-identified patent and that said Letters Patent is hereby corrected as shown below:

On the face page, in field (56), under "U.S. Patent Documents", in column 2, line 1, delete "Reiner" and insert -- Reimer --, therefor.

Signed and Sealed this

Fifteenth Day of April, 2008

JON W. DUDAS  
*Director of the United States Patent and Trademark Office*